United States Patent
Oyama

(10) Patent No.: US 7,205,670 B2
(45) Date of Patent: Apr. 17, 2007

(54) SEMICONDUCTOR DEVICE AND MANUFACTURING METHOD THEREFOR

(75) Inventor: Katsuhiko Oyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 200 days.

(21) Appl. No.: 10/649,940

(22) Filed: Aug. 28, 2003

(65) Prior Publication Data

US 2004/0115863 A1 Jun. 17, 2004

(30) Foreign Application Priority Data

Aug. 30, 2002 (JP) .............................. 2002-254128

(51) Int. Cl.
  H01L 23/48 (2006.01)
  H01L 23/52 (2006.01)
  H01L 23/29 (2006.01)
  H01L 23/02 (2006.01)
  H01L 29/40 (2006.01)

(52) U.S. Cl. ...................... 257/778; 257/686; 257/777; 257/790

(58) Field of Classification Search ................ 257/686, 257/777–778, 780, 790
See application file for complete search history.

(56) References Cited

U.S. PATENT DOCUMENTS 5,883,426 A * 3/1999 Tokuno et al. .............. 257/686
6,180,881 B1 * 1/2001 Isaak ......................... 174/52.4
6,271,056 B1 * 8/2001 Farnworth et al. .......... 438/106

FOREIGN PATENT DOCUMENTS

| JP | 5-29533 | | 2/1993 |
| JP | 05-029533 | * | 2/1993 |
| JP | 10-173125 | | 6/1998 |
| JP | 2002-9227 | | 1/2002 |
| JP | 2002-368185 | | 12/2002 |

OTHER PUBLICATIONS

Notification of Reasons for Rejection from Japanese Patent Office dated Aug. 19, 2005 in Japanese Application No. 2002-254128, and English translation thereof.
Oyama et al.; "Laminated-Chip Semiconductor Device"; U.S. Appl. No. 10/156,819, filed May 30, 2002.

* cited by examiner

*Primary Examiner*—Chuong Anh Luu
(74) *Attorney, Agent, or Firm*—Finnegan, Henderson, Farabow, Garrett & Dunner, L.L.P.

(57) ABSTRACT

A semiconductor device is disclosed which comprises a plurality of semiconductor chips having a plurality of terminals, two chip mounting bases on each of which at least one of the semiconductor chips is mounted and a plurality of chip interconnections electrically connected to the terminals of the mounted semiconductor chip are formed into substantially the same pattern and which are stacked in two layers, one interconnection base which is interposed between the two chip mounting bases and on which a plurality of intermediate interconnections electrically connected to the chip interconnections are formed into a pattern different from the pattern of the chip interconnections, and a plurality of interlevel interconnections which are formed in a plurality of through holes extending through the chip mounting bases and the interconnection base at once along a stacking direction and electrically connect the chip interconnections and the intermediate interconnections.

17 Claims, 10 Drawing Sheets ental interconnection boards from two outer sides in
the stacking direction. At this time, the external terminal
board is set on a side on which the external terminal board
contacts the interconnection board, and the insulating cover
is set on a side on which the cover contacts the chip
mounting board. The external terminal board and insulating
cover are integrated into the interconnection boards integrated by thermocompression bonding.

SEMICONDUCTOR DEVICE AND MANUFACTURING METHOD THEREFOR

CROSS-REFERENCE TO RELATED APPLICATIONS

This application is based upon and claims the benefit of priority from the prior Japanese Patent Application No. 2002-254128, filed Aug. 30, 2002, the entire contents of which are incorporated herein by reference.

BACKGROUND OF THE INVENTION

1. Field of the Invention

The present invention relates to an interconnection technique around a semiconductor chip and, more particularly, to the interconnection design of a multilayered semiconductor package serving as a semiconductor device having a multilayered structure in which a plurality of semiconductor chips are stacked in a plurality of layers, and a method of manufacturing a semiconductor device having a multilayered structure.

2. Description of the Related Art

Recently, semiconductor devices are integrated more and more. An example of highly integrated semiconductor devices is a so-called multichip package in which one semiconductor device incorporates a plurality of semiconductor chips. Multichip packages include a so-called multilayered semiconductor package constituted by stacking a plurality of semiconductor chips in a plurality of layers. A multilayered semiconductor package manufacturing process generally called an SBM (System Block Module) will be briefly exemplified.

First, one or a plurality of semiconductor chips are mounted on a plurality of chip mounting boards. Each chip mounting board has a plurality of chip interconnections electrically connected to a plurality of terminals of each semiconductor chip. The semiconductor chip is mounted on the chip mounting board by connecting terminals to chip interconnections. The chip mounting board on which a predetermined number of semiconductor chips are mounted is integrated into an interconnection board. In general, the interconnection board is formed to a size enough to mount a plurality of chip mounting boards at once on one interconnection board. The interconnection board has a plurality of intermediate interconnections electrically connected to the terminals of semiconductor chips via chip interconnections formed on chip mounting boards. A plurality of chip mounting boards on each of which a predetermined number of semiconductor chips are mounted are mounted at predetermined positions on an interconnection board by, e.g., a flip chip method so as to electrically connect the chip interconnections of the chip mounting boards to the intermediate interconnections of the interconnection boards.

Then, a predetermined number of interconnection boards on each of which a predetermined number of chip mounting boards are mounted are stacked along the direction of thickness of the interconnection boards. At this time, the interconnection boards are so stacked as to alternately arrange the chip mounting boards and the interconnection boards along the stacking direction. In addition, interconnection boards are so stacked as to electrically connect the chip interconnections of chip mounting boards and the intermediate interconnections of the interconnection boards that are adjacent to each other in the stacking direction. The stacked interconnection boards are integrated by, e.g., thermocompression bonding. Subsequently, an external terminal board and insulating cover are so arranged as to sandwich the integrated interconnection boards from two outer sides in the stacking direction. At this time, the external terminal board is set on a side on which the external terminal board contacts the interconnection board, and the insulating cover is set on a side on which the cover contacts the chip mounting board. The external terminal board and insulating cover are integrated into the interconnection boards integrated by thermocompression bonding.

The external terminal board has a plurality of external terminal interconnections electrically connected to the intermediate interconnections of an adjacent interconnection board. The external terminal interconnection has external terminals for electrically connecting signal paths inside the multilayered semiconductor package to signal paths outside the package. The external terminal board is so arranged as to electrically connect the external terminal interconnections to intermediate interconnections formed on an adjacent interconnection board. The semiconductor chips are electrically connected to wiring lines outside the package by predetermined paths via the chip interconnections, intermediate interconnections, and external terminal interconnections. The semiconductor chips, chip interconnections, and intermediate interconnections inside the package are protected from the outside by the insulating cover and external terminal board.

Finally, the interconnection boards integrated with the external terminal board and insulating cover are divided into a plurality of blocks having a predetermined number of semiconductor chips in each layer. As a result, an SBM (System Block Module) functioning as a desired semiconductor system is obtained.

A semiconductor chip mounted on an SBM formed by the above-described process is formed as, e.g., a memory chip. The memory chip generally has a plurality of data pins as terminals. The data pin must be electrically connected to a wiring line outside a module or the like independently for each data pin of each semiconductor chip in each layer. The signal paths of the data pins are made electrically independent by forming intermediate interconnections into the same pattern in layers and forming chip interconnections into different patterns in the layers. In this case, a chip mounting board to be arranged in a predetermined layer must be so managed as not to be replaced with a chip mounting board to be arranged in another layer. Replacement of chip mounting boards in two arbitrary layers within a module makes the entire SBM defective. This leads to a low SBM yield, and a trouble may occur in the SBM manufacturing process.

From this, when the signal paths of data pins are independently set by the chip interconnections of chip mounting boards, a plurality of chip mounting boards must be managed with extra care. The SBM manufacturing process becomes very cumbersome. This results in a low production efficiency and high manufacturing cost in mass production of SBMs.

BRIEF SUMMARY OF THE INVENTION

According to an aspect of the invention, there is provided a semiconductor device comprising: a plurality of semiconductor chips having a plurality of terminals; two chip mounting bases on each of which at least one of the semiconductor chips is mounted and a plurality of chip interconnections electrically connected to the terminals of the mounted semiconductor chip are formed into substantially the same pattern and which are stacked in two layers along a direction of thickness; one interconnection base which is interposed between the two chip mounting bases and on which a plurality of intermediate interconnections electrically connected to the chip interconnections are formed into a pattern different from the pattern of the chip interconnections; and a plurality of interlevel interconnections which are formed in a plurality of through holes extending through the chip mounting bases and the interconnection base at once along a stacking direction and electrically connect the chip interconnections and the intermediate interconnections in the stacking direction of the bases.

According to another aspect of the invention, there is provided a semiconductor device comprising: a plurality of semiconductor chips having a plurality of terminals; two chip mounting bases on each of which at least one of the semiconductor chips is mounted and a plurality of chip interconnections electrically connected to the terminals of the mounted semiconductor chip are formed into substantially the same pattern and which are stacked in two layers along a direction of thickness; a first interconnection base which is interposed between the two chip mounting bases and on which a plurality of intermediate interconnections electrically connected to the chip interconnections are formed into a pattern different from the pattern of the chip interconnections; a second interconnection base which is arranged together with the first interconnection base alternately with the chip mounting bases and on which a plurality of intermediate interconnections electrically connected to the chip interconnections are formed into a pattern different from the pattern of the chip interconnections and the pattern of the intermediate interconnections formed on the first interconnection base; and a plurality of interlevel interconnections which are formed in a plurality of through holes extending through the chip mounting bases, the first interconnection base, and the second interconnection base at once along a stacking direction and electrically connect the chip interconnections and the intermediate interconnections in the stacking direction of the bases.

According to a further aspect of the invention, there is provided a semiconductor device comprising: a plurality of semiconductor chips having a plurality of terminals; a plurality of chip mounting bases on each of which at least one of the semiconductor chips is mounted and which are stacked in a plurality of layers along a direction of thickness; a plurality of chip interconnections which are formed into substantially the same pattern on the chip mounting bases and electrically connected to the terminals of the semiconductor chips mounted on the chip mounting bases; a plurality of interconnection bases which are arranged alternately with the chip mounting bases along a stacking direction of the chip mounting bases; a plurality of intermediate interconnections which are formed into predetermined patterns for the respective interconnection bases that are different from the pattern of the chip interconnections, and electrically connected to the chip interconnections; and a plurality of interlevel interconnections which are formed in a plurality of through holes extending through the chip mounting bases and the interconnection bases at once along the stacking direction and electrically connect the chip interconnections and the intermediate interconnections in the stacking direction of the bases.

According to an aspect of the invention, there is provided a semiconductor device manufacturing method comprising: stacking, in two layers along a direction of thickness, two chip mounting bases on each of which a plurality of chip interconnections electrically connected to a plurality of terminals of semiconductor chips are formed into substantially the same pattern and at least one of the semiconductor chips is mounted by electrically connecting the terminals to the chip interconnections; interposing, between the chip mounting bases, one interconnection base on which a plurality of intermediate interconnections electrically connected to the chip interconnections are formed into a pattern different from the pattern of the chip interconnections; and forming a plurality of through holes through the chip mounting bases and the interconnection base at once along a stacking direction, and forming, in the through holes, a plurality of interlevel interconnections which electrically connect the chip interconnections and the intermediate interconnections in the stacking direction of the bases.

According to another aspect of the invention, there is provided a semiconductor device manufacturing method comprising: stacking, in two layers along a direction of thickness, two chip mounting bases on each of which a plurality of chip interconnections electrically connected to a plurality of terminals of semiconductor chips are formed into substantially the same pattern and at least one of the semiconductor chips is mounted by electrically connecting the terminals to the chip interconnections; interposing, between the chip mounting bases, a first interconnection base on which a plurality of intermediate interconnections electrically connected to the chip interconnections are formed into a pattern different from the pattern of the chip interconnections; arranging, together with the first interconnection base alternately with the chip mounting bases, a second interconnection base on which a plurality of intermediate interconnections electrically connected to the chip interconnections are formed into a pattern different from the pattern of the chip interconnections and the pattern of the intermediate interconnections formed on the first interconnection base; and forming a plurality of through holes through the chip mounting bases, the first interconnection base, and the second interconnection base at once along a stacking direction, and forming, in the through holes, a plurality of interlevel interconnections which electrically connect the chip interconnections and the intermediate interconnections in the stacking direction of the bases.

According to a further aspect of the invention, there is provided a semiconductor device manufacturing method comprising: stacking, in a plurality of layers along a direction of thickness, a plurality of chip mounting bases on each of which a plurality of chip interconnections electrically connected to a plurality of terminals of semiconductor chips are formed into substantially the same pattern and at least one of the semiconductor chips is mounted by electrically connecting the terminals to the chip interconnections; arranging, alternately with the chip mounting bases along a stacking direction of the chip mounting bases, a plurality of interconnection bases on each of which a plurality of intermediate interconnections electrically connected to the chip interconnections are formed into predetermined patterns different from the pattern of the chip interconnections; and forming a plurality of through holes through the chip mounting bases and the interconnection bases at once along the stacking direction, and forming, in the through holes, a plurality of interlevel interconnections which electrically connect the chip interconnections and the intermediate interconnections in the stacking direction of the bases.

DETAILED DESCRIPTION OF THE INVENTION

Prior to a description of an embodiment according to the present invention, a technique which has been devised by the present inventors in order to solve the conventional problems described above will be explained.

To solve the conventional problems, the present inventors have already proposed a semiconductor device in which the signal paths of data pins are independently set by the intermediate interconnections of interconnection boards (Japanese Patent Application No. 2001-167185). More specifically, this semiconductor device is an SBM in which the signal paths of data pins are made electrically independent by forming chip interconnections into the same pattern in layers and forming intermediate interconnections into different patterns in the layers. An example of an SBM having this interconnection structure will be briefly explained with reference to FIG. 11. For illustrative convenience, the entire memory chip mounted on a chip mounting board is not illustrated in FIG. 11, and one data pin of a memory chip is illustrated for each chip mounting board. Similarly, for illustrative convenience, chip mounting boards, interconnection boards, an external terminal board, and an insulating cover are spaced apart from each other in FIG. 11.

Figure 11:
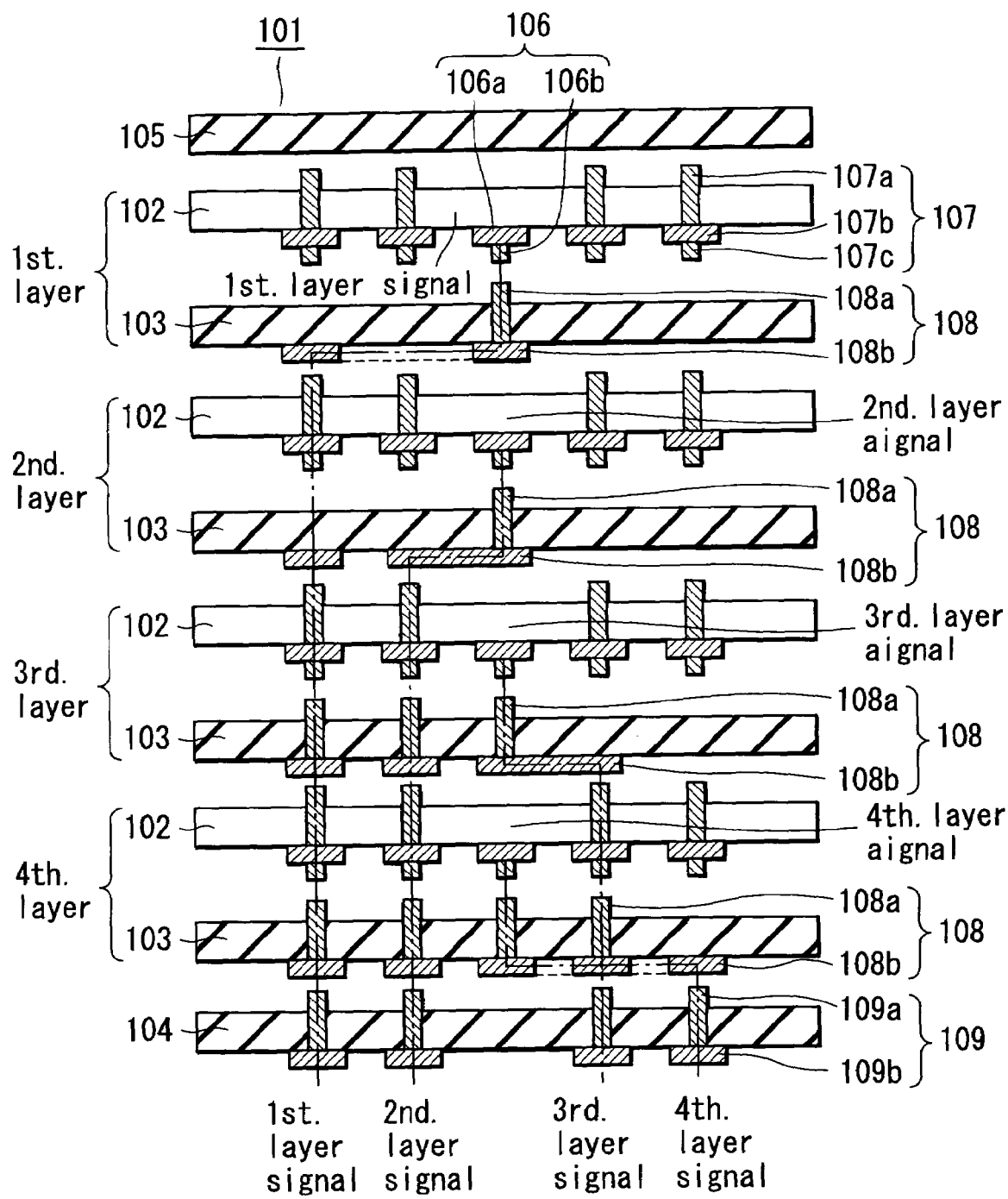
FIG. 11 is a sectional view schematically showing an interconnection structure when the interlevel interconnection of the semiconductor device shown in FIG. 9 is formed using a via plug.

In an SBM (multilayered semiconductor package) 101 shown in FIG. 11, four chip mounting boards 102 and four interconnection boards 103 are alternately arranged and stacked. One memory chip (not shown) is mounted on each chip mounting board 102. An external terminal board 104 and insulating cover 105 are so arranged as to sandwich, from two outer sides in the stacking direction, the chip mounting boards 102 and interconnection boards 103 which are stacked in four layers. In FIG. 11, layers of the chip mounting boards 102 and interconnection boards 103 are defined as first, second, third, and fourth layers sequentially from the top. The insulating cover 105 and external terminal board 104 are defined as the zeroth and fifth layers, respectively.

In FIG. 11, the four memory chips are mounted on the lower major surfaces of the chip mounting boards 102. A data pin 106 of each memory chip is comprised of a land 106a and bump 106b. All chip interconnections 107 are formed into the same pattern for the chip mounting boards 102 in the four layers. Each chip interconnection 107 is comprised of a via plug 107a, land 107b, and bump 107c. The via plug 107a is formed through the chip mounting board 102 in the direction of thickness of the chip mounting board 102. The land 107b and bump 107c are formed on the lower major surface of the chip mounting board 102. All intermediate interconnections 108 are formed into different patterns for the interconnection boards 103 in the four layers. Each intermediate interconnection 108 is comprised of a via plug 108a and land 108b. The via plug 108a is formed through the interconnection board 103 in the direction of thickness of the interconnection board 103. The land 108b is formed on the lower major surface of the interconnection board 103.

External terminal interconnections 109 are electrically independently formed in the external terminal board 104. Each external terminal interconnection 109 is comprised of a via plug 109a and land 109b. The via plug 109a is formed through the external terminal board 104 in the direction of thickness of the external terminal board 104. The land 109b is formed on the lower major surface of the external terminal board 104. The land 109b is exposed outside the SBM 101, and functions as an external terminal.

As shown in FIG. 11, all the data pins 106 in the first to fourth layers are electrically connected to the via plugs 108a of the underlying intermediate interconnections 108 at the same positions along the stacking direction. The via plugs 107a, lands 107b, and bumps 107c of the chip interconnections 107 in the respective layers are also formed at the same positions along the stacking direction. That is, all the chip interconnections 107 are formed into the same pattern in the respective layers. To the contrary, the intermediate interconnections 108 in the respective layers are formed into different patterns in the respective layers so as to switch the signal paths of the data pins 106 in the layers between the layers.

As represented by a chain line in FIG. 11, the data pins 106 in the respective layers can be electrically connected to wiring lines outside the SBM 101 or the like via electrically independent signal paths in all the first to four layers.

The SBM 101 having this interconnection structure is managed such that an interconnection board 103 to be arranged in a predetermined layer is not replaced with an interconnection board 103 to be arranged in another layer. The four chip mounting boards 102 need not be classified and managed for each layer. As described above, in the manufacturing process of an actual SBM 101, a plurality of chip mounting boards 102 are mounted on one interconnection board 103. When the interconnection structure inside a multilayered semiconductor package is set like the SBM 101, the burden of managing the chip mounting boards 102 and interconnection boards 103 can be reduced in inverse proportion to an increase in the number of chip mounting boards 102 mounted on one interconnection board 103. At the same time, the burden of managing the chip mounting boards 102 and interconnection boards 103 can be reduced in inverse proportion to an increase in the stacking numbers of chip mounting boards 102 and interconnection boards 103. Accordingly, a semiconductor device can be provided at a high yield, high production efficiency, and low manufacturing cost. In the SBM 101, various conventional problems owing to board management or the like are completely solved.

To ensure signal paths between layers, the via plugs 107a, 108a, and 109a must be formed individually for the chip mounting board 102, interconnection board 103, and external terminal board 104. As shown in FIG. 11, the via plugs 107a, 108a, and 109a must be aligned along the stacking direction. In the SBM 101, no effort has been made for reducing cumbersome manufacturing work due to the internal structure of a semiconductor device having via plugs and the labor taken for manufacturing work.

The embodiment of the present invention has been made to solve the conventional problems, also solve various problems caused by via plugs, increase the yield and production efficiency in mass production of multilayered semiconductor packages, and reduce the manufacturing cost. Details of the present invention will be explained by the embodiment with reference to several views of the accompanying drawing.

A semiconductor device according to the embodiment of the present invention will be described with reference to FIGS. 1A to 4B and FIGS. 8A to 10.

Figure 8A:
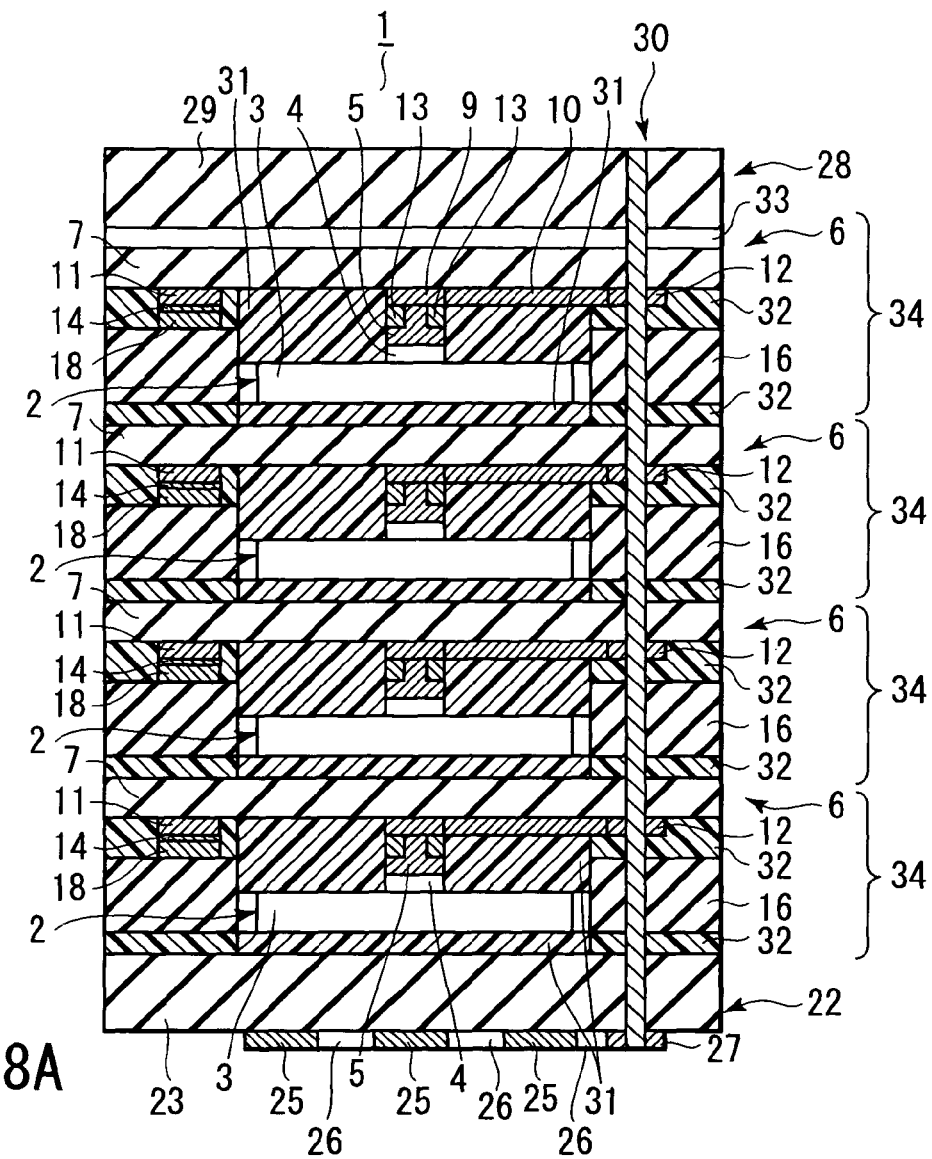
FIG. 8A is a sectional view showing still another step in the semiconductor device manufacturing method according to the embodiment.

As shown in FIG. 8A, a semiconductor device 1 according to the embodiment is formed as a so-called multichip package which incorporates four semiconductor chips 2. The semiconductor device 1 is formed as a so-called multilayered semiconductor package in which four semiconductor chips 2 are stacked in four layers. In the following description, the semiconductor device 1 will be explained as a multilayered semiconductor package particularly called an SBM (System Block Module).

In the SBM 1 of the embodiment, as shown in FIG. 8A, one semiconductor chip 2 is mounted on each of four chip mounting bases 6. The chip mounting bases 6 on which the semiconductor chips 2 are mounted are stacked in four layers along the direction of thickness of the chip mounting bases 6. Four interconnection bases 15 are arranged and stacked alternately with the chip mounting bases 6 along the stacking direction of the chip mounting bases 6 so as to pair the interconnection bases 15 with the chip mounting bases 6. One external terminal base 22 and one insulating cover 28 are so arranged as to sandwich, from two outer sides in the stacking direction, the pair of chip mounting bases 6 and interconnection bases 15 which are stacked in four layers. The external terminal base 22 is arranged adjacent to the interconnection base 15. The insulating cover 28 is arranged adjacent to the chip mounting base 6. The semiconductor chips 2 in the respective layers are electrically connected to wiring lines (not shown) outside the SBM 1 via an interlevel interconnection 30 extending through the SBM 1 in the direction of thickness of the SBM 1 and via interconnections in the respective layers.

In FIGS. 8A to 10, layers of the chip mounting bases 6 and interconnection bases 5 are defined as first, second, third, and fourth layers sequentially from the top. The insulating cover 28 and external terminal base 22 are defined as the zeroth and fifth layers, respectively. In this case, an interconnection base 15 in the first layer can be referred to as the first interconnection base 15; an interconnection base 15 in the second layer, the second interconnection base 15; an interconnection base 15 in the third layer, the third interconnection base 15; and an interconnection base 15 in the fourth layer, the fourth interconnection base 15.

The arrangement of the SBM 1 will be explained in detail by main building components with reference to several views of the accompanying drawing.

Figure 1A:
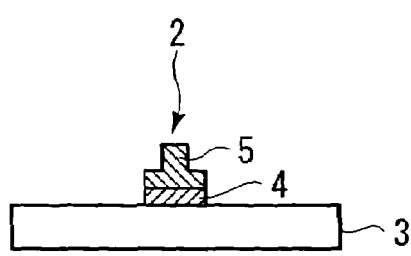
FIG. 1A is a sectional view showing the semiconductor chip of a semiconductor device according to an embodiment.
Figure 1B:
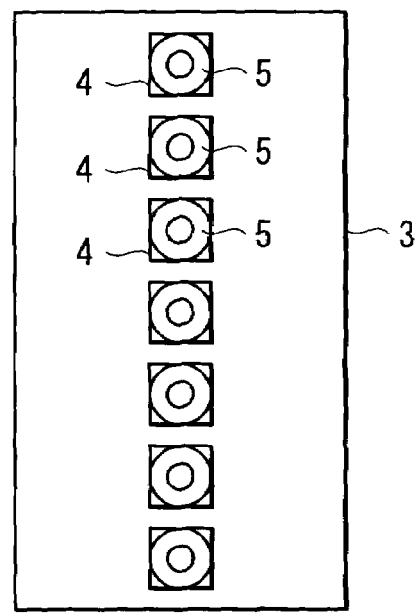
FIG. 1B is a plan view showing the semiconductor chip of the semiconductor device according to the embodiment.

As shown in FIG. 1A, in each of the four semiconductor chips 2 of the SBM 1, a chip main body 3 is formed as thin as about 50 µm. As shown in FIG. 1B, electrode pads 4 are formed at seven portions on one major surface of the chip main body 3. One stud bump 5 is formed as a terminal on each pad 4. The stud bump 5 is formed into a projection with a diameter of about 70 µm and a height of about 80 µm. The stud bump 5 is formed from, e.g., gold (Au).

Figure 2A:
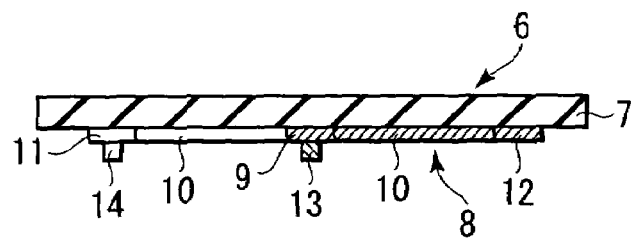
FIG. 2A is a sectional view showing the chip connection base of the semiconductor device according to the embodiment.
Figure 2B:
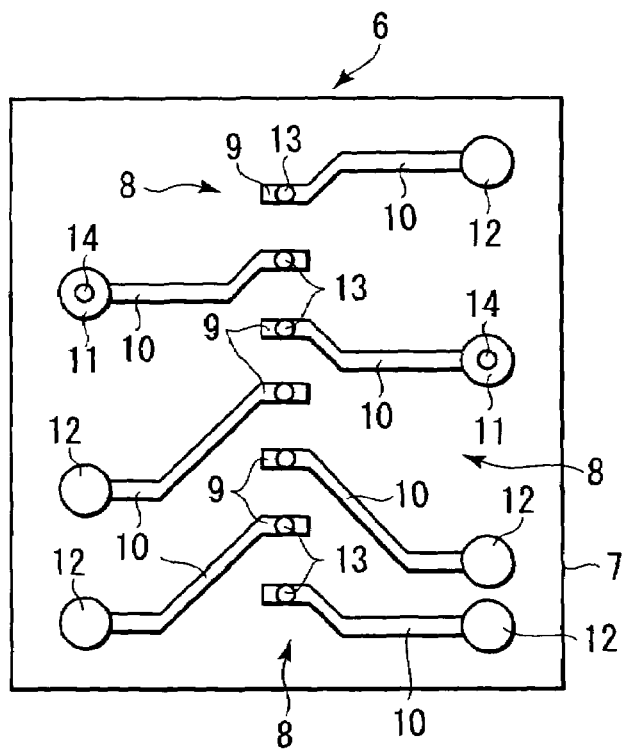
FIG. 2B is a plan view showing the chip connection base of the semiconductor device according to the embodiment.

As shown in FIG. 2A, on the chip mounting base 6 on which at least one semiconductor chip 2 is mounted, a base main body 7 is formed as thin as about 50 µm. The base main body 7 is formed from, e.g., epoxy glass as a kind of insulating material, and also called an insulating base. As shown in FIG. 2B, a plurality of chip interconnections 8 which are individually electrically connected to the stud bumps 5 of the semiconductor chip 2 are formed on one major surface of the base main body 7. In the SBM 1 of the embodiment, one semiconductor chip 2 is mounted on one chip mounting base 6. As described above, the semiconductor chip 2 has seven stud bumps 5. Hence, seven chip interconnections 8 are formed on one chip mounting base 6. The SBM 1 of the embodiment adopts four chip mounting bases 6. The chip interconnections 8 are formed into substantially the same pattern on one major surface of the base main body 7 for the four chip mounting bases 6.

As shown in FIGS. 2A and 2B, the chip interconnection 8 is comprised of an inner lead 9, relay line 10, and interlevel connection land 11 or through hole land 12. The inner lead 9 is a portion which is electrically connected to the stud bump 5 of the semiconductor chip 2. The interlevel connection land 11 is a portion which is electrically connected to an intermediate interconnection 17 formed on the interconnection base 15 to be described later. The through hole land 12 is a portion, i.e., feedthrough terminal to which the interlevel interconnection 30 to be described later is electrically connected through the through hole land 12. The relay line 10 is a portion which electrically connects the inner lead 9 and the interlevel connection land 11 or through hole land 12. The chip interconnection 8 is formed at a height of about 15 µm from one major surface of the base main body 7 of the chip mounting base 6. The chip interconnection 8 is formed by etching using, e.g., copper (Cu).

A chip connection bump 13 is formed on the inner lead 9 so as to abut against the stud bump 5 of the semiconductor chip 2. An interlevel connection bump 14 is formed on the interlevel connection land 11 so as to abut against an interlevel connection land 18 of the intermediate interconnection 17 formed on the interconnection base 15. The chip connection bump 13 and interlevel connection bump 14 are formed at a height of about 10 µm. The chip connection bump 13 and interlevel connection bump 14 are formed by electroplating using, e.g., an alloy (Sn—Ag) of tin and silver. The semiconductor chip 2 is mounted on the chip mounting base 6 by, e.g., a flip chip method.

Figure 3A:
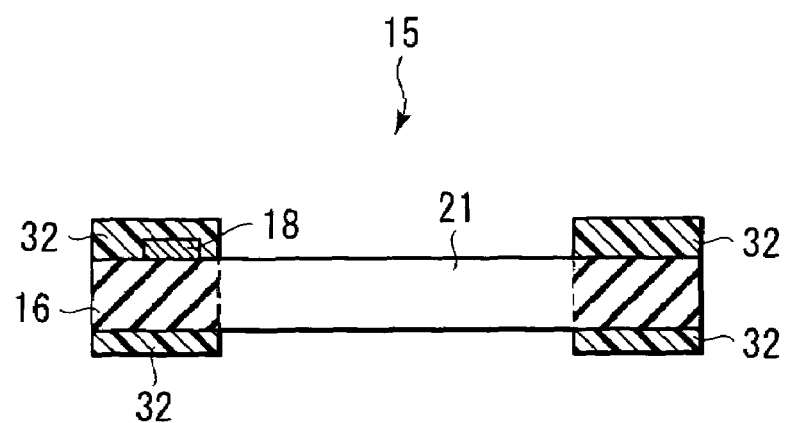
FIG. 3A is a sectional view showing the interconnection base of the semiconductor device according to the embodiment.
Figure 3B:
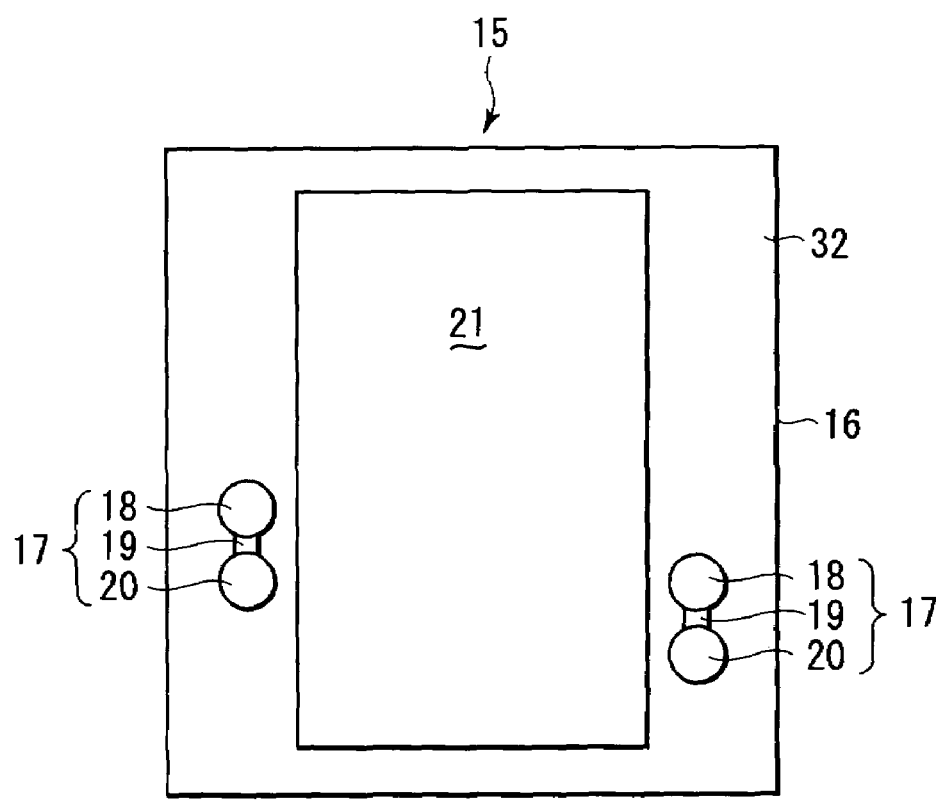
FIG. 3B is a plan view showing the interconnection base of the semiconductor device according to the embodiment.

As shown in FIG. 3A, on the interconnection base 15 which is paired with the above-mentioned chip mounting base 6, a base main body 16 is formed as thin as about 130 µm. The base main body 16 is formed from, e.g., epoxy glass as a kind of insulating material, and also called an insulating base. As shown in FIG. 3B, a plurality of intermediate interconnections 17 which are individually electrically connected to the chip interconnections 8 of an adjacent chip mounting base 6 are formed on one major surface of the base main body 16.

In the SBM 1 of the embodiment, four interconnection bases 15 are arranged and stacked alternately with the four chip mounting bases 6 along the stacking direction of the chip mounting bases 6. In the SBM 1 of the embodiment, signal paths from the stud bumps 5 of the semiconductor chips 2 in the respective layers are set independently for each stud bump 5. At this time, signal paths from the stud bumps 5 are switched between the layers by using the intermediate interconnections 17 of the interconnection bases 15. Hence, the intermediate interconnections 17 of the interconnection bases 15 are formed into different interconnection patterns between the interconnection bases 15. Also, the intermediate interconnections 17 of the interconnection bases 15 are formed into interconnection patterns different from the pattern of the chip interconnections 8 of the chip mounting bases 6 described above. The number of intermediate interconnections 17 on the interconnection base 15 may be different between the interconnection bases 15. FIG. 3B shows the interconnection pattern of the intermediate interconnection 17 formed on one of the four interconnection bases 15.

As shown in FIG. 3B, the intermediate interconnection 17 is comprised of the interlevel connection land 18, a relay line 19, and a through hole land 20. The interlevel connection land 18 is a portion which abuts against the interlevel connection bump 14 of the interlevel connection land 11 of the chip interconnection 8 formed on an adjacent chip mounting base 6. The interlevel connection land 18 of the intermediate interconnection 17 contacts the interlevel connection land 11 of the chip interconnection 8 via the interlevel connection bump 14 of the chip interconnection 8 to electrically connect the intermediate interconnection 17 and chip interconnection 8. The through hole land 20 is a portion, i.e., feedthrough terminal to which the interlevel interconnection 30 to be described later is electrically connected through the through hole land 20. The relay line 19 is a portion which electrically connects the interlevel connection land 18 and through hole land 20. The intermediate interconnection 17 is formed at a height of about 10 µm from one major surface of the base main body 16 of the interconnection base 15. The intermediate interconnection 17 is formed by etching using, e.g., copper (Cu).

In the interconnection base 15, as shown in FIGS. 3A and 3B, a cavity (hole) 21 is formed at the center of the base main body 16 in the direction of thickness. The cavity 21 is formed to prevent interference between the semiconductor chip 2 and the interconnection base 15 in integrating the chip mounting base 6 having the semiconductor chip 2 and the interconnection base 15. The cavity 21 is formed with a size and shape enough to store the semiconductor chip 2 mounted on the chip mounting base 6. FIG. 3A is a cross-sectional view showing the interlevel connection land 18 and cavity 21 in FIG. 3B.

Figure 4A:
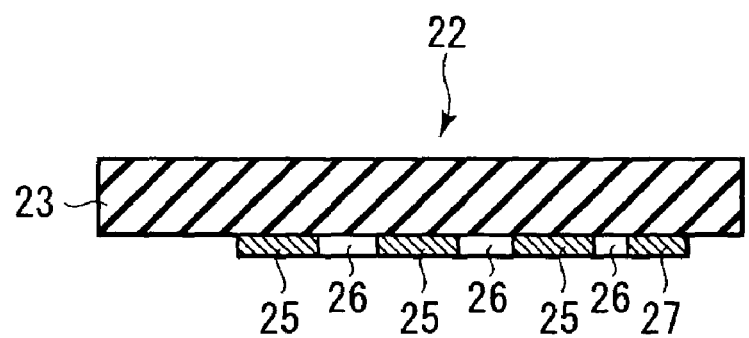
FIG. 4A is a sectional view showing the external terminal base of the semiconductor device according to the embodiment.
Figure 4B:
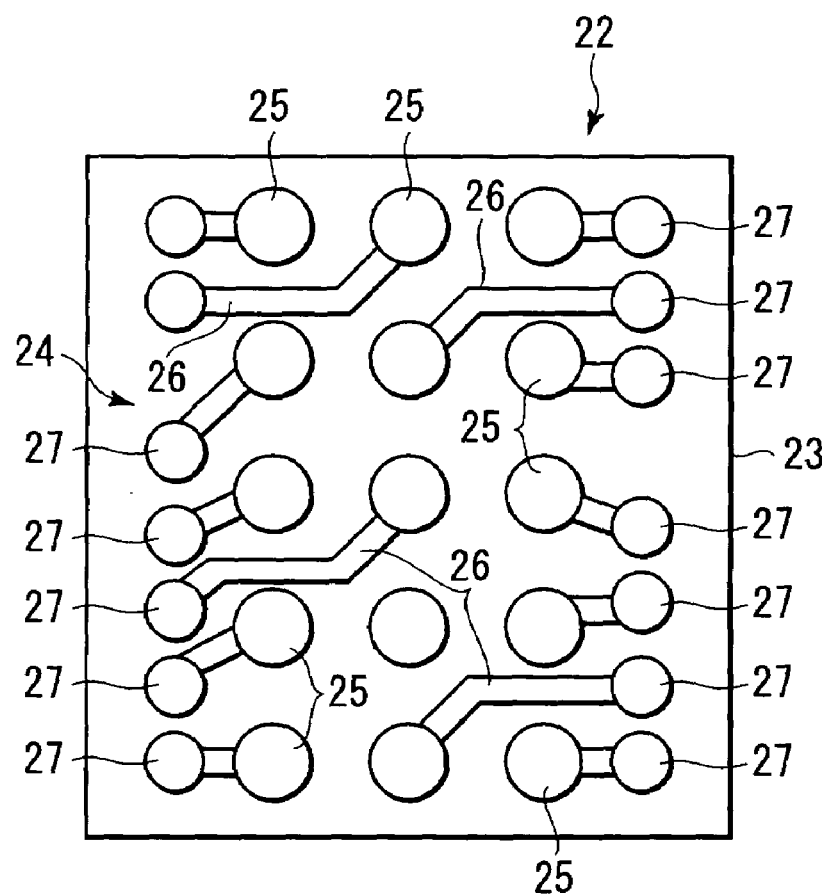
FIG. 4B is a plan view showing the external terminal base of the semiconductor device according to the embodiment.

As shown in FIG. 4A, on the external terminal base 22 arranged adjacent to the interconnection base 15, a base main body 23 is formed as thin as about 130 µm. The base main body 23 is formed from, e.g., epoxy glass as a kind of insulating material, and also called an insulating base. As shown in FIG. 4B, a plurality of external terminal interconnections 24 which are electrically connected to the stud bumps 5 of the semiconductor chips 2 in the respective layers via the interlevel interconnection 30 to be described later are formed on one major surface of the base main body 23.

As shown in FIG. 4B, the external terminal interconnection 24 is comprised of an external terminal 25, relay line 26, and through hole land 27. The external terminals 25 are portions which electrically connect the stud bumps 5 of the four semiconductor chips 2 of the SBM 1 and wiring lines (not shown) outside the SBM 1. The through hole lands 27 are portions, i.e., feedthrough terminals to which the interlevel interconnections 30 to be described later are electrically connected through the through hole lands 27. The relay lines 26 are portions which electrically connect the external terminals 25 and through hole lands 27. Note that not all the external terminal interconnections 24 need be comprised of the external terminals 25, relay lines 26, and through hole lands 27. The external terminal interconnections 24 suffice to have a proper arrangement corresponding to an electrical connection state between the stud bumps 5 of the four semiconductor chips 2 of the SBM 1 or a connection state between the stud bumps 5 and external wiring lines. For example, an external terminal interconnection 24 formed from only the external terminal 25 may exist. The external terminal interconnection 24 is formed at a height of about 10 µm from one major surface of the base main body 23 of the external terminal base 22. The external terminal interconnection 24 is formed by etching using, e.g., copper (Cu).

As shown in FIG. 8A, on the insulating cover 28 which is arranged adjacent to the chip mounting base 6, a base main body 29 is formed as thin as about 130 µm. The base main body 29 is formed from, e.g., epoxy glass as a kind of insulating material.

As shown in FIG. 8A, the interlevel interconnection 30 is formed through the SBM 1 along the direction of thickness. In practice, a plurality of interlevel interconnections 30 are formed, but FIG. 8A illustrates only one interlevel interconnection 30 for illustrative convenience. The interlevel interconnection 30 extends through the through hole lands 12, 20, and 27 of the chip interconnections 8 and intermediate interconnections 17 in the respective layers, and the external terminal interconnection 24. With this structure, the chip interconnections 8 and intermediate interconnections 17 in the respective layers, and the external terminal interconnections 24 are electrically connected. The semiconductor chips 2 in the respective layers are electrically connected to external wiring lines via predetermined paths for the respective stud bumps 5. Note that the interlevel interconnections 30 do not extend through all the through hole lands 12, 20, and 27. The interlevel interconnections 30 suffice to extend through predetermined through hole lands 12, 20, and 27 so as to form a proper signal path corresponding to an electrical connection state between the stud bumps 5 of the semiconductor chips 2 or a connection state between the stud bumps 5 and external wiring lines.

Figure 8B:
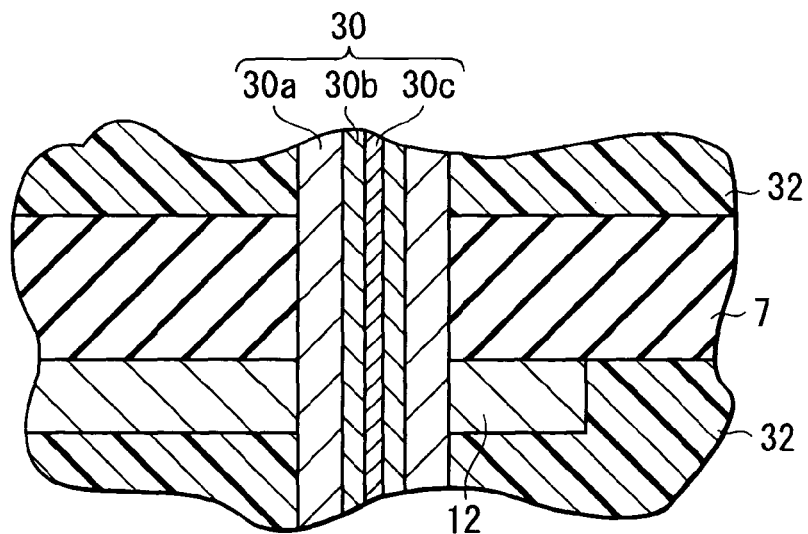
FIG. 8B is a sectional view showing still another step in the semiconductor device manufacturing method according to the embodiment.

As shown in FIG. 8B, the interlevel interconnection 30 is formed in a plurality of through holes (not shown) which are formed through the SBM 1 in the direction of thickness. The interlevel interconnection 30 is formed from a three-layered structure of a Cu (copper) interconnection 30a, Ni (nickel) interconnection 30b, and Au (gold) interconnection 30c sequentially from the outside. The Cu interconnection 30a is formed at a thickness of about 15 μm. The Ni interconnection 30b is formed at a thickness of about 3 to 5 μm. The Au interconnection 30c is formed at a thickness of about 0.05 μm. The Cu interconnection 30a is formed by, e.g., electroplating. The Ni interconnection 30b and Au interconnection 30c are formed by, e.g., electroless plating. The two ends of the interlevel interconnection 30 preferably undergo predetermined protection processing such as anti-oxidant treatment. This also applies to the through hole land 27 and external terminal 25 of the external terminal base 22.

As shown in FIG. 8A, a sheet-like chip adhesive 31 having a thickness of, e.g., about 50 μm is interposed between each semiconductor chip 2 and each chip mounting base 6. Similarly, an interlevel connection adhesive 32 having a thickness of, e.g., about 20 μm is applied to a major surface of each interconnection base 15 on which no intermediate interconnection 17 is formed. The interlevel connection adhesive 32 is also applied to a major surface of each interconnection base 15 on which the intermediate interconnection 17 is formed. A cover adhesive 33 having a thickness of, e.g., about 20 μm is applied to a major surface of the insulating cover 28 that faces the chip mounting base 6.

Figure 9:
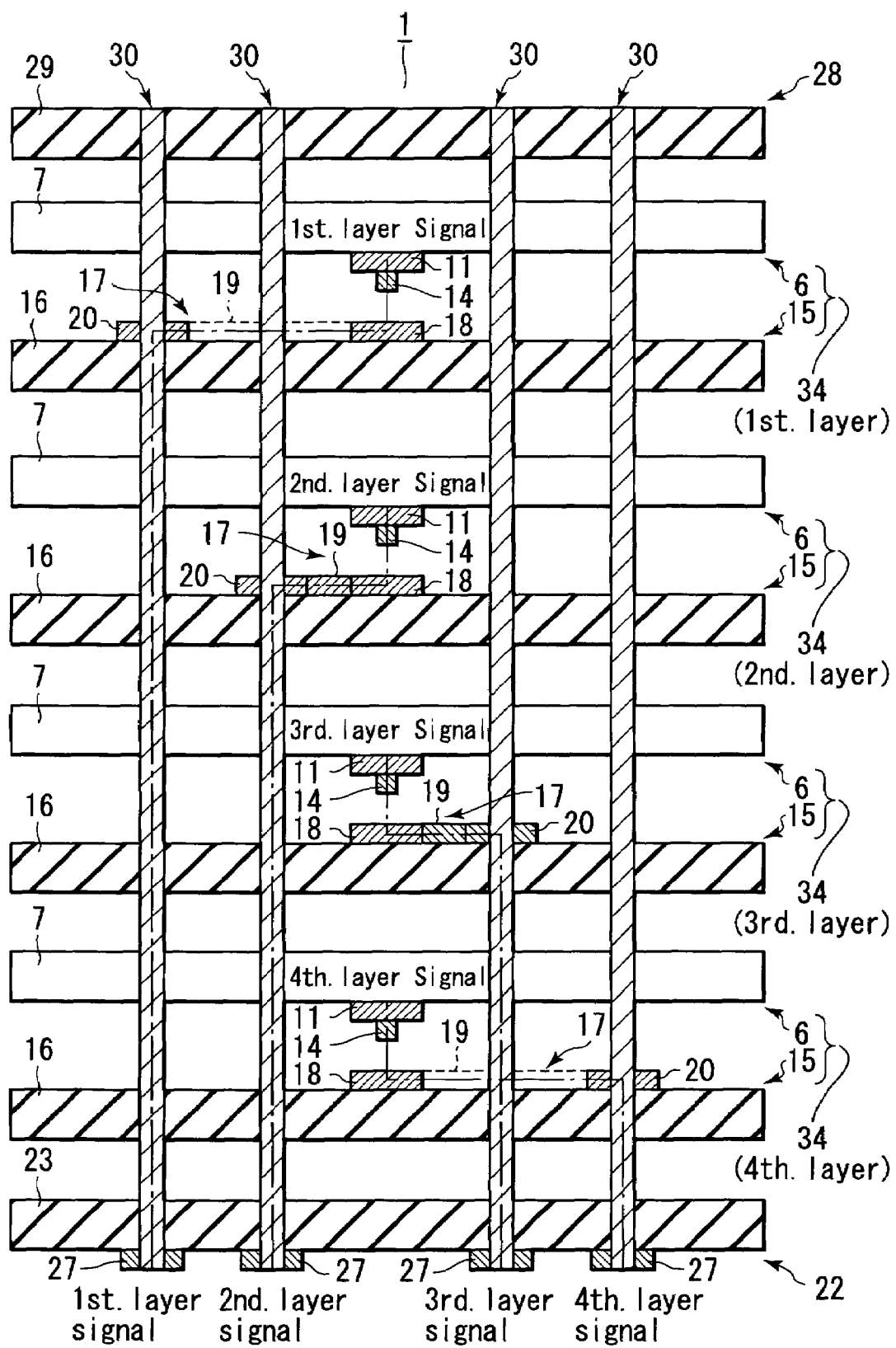
FIG. 9 is a sectional view schematically showing an interconnection structure inside the semiconductor device according to the embodiment.
Figure 10:
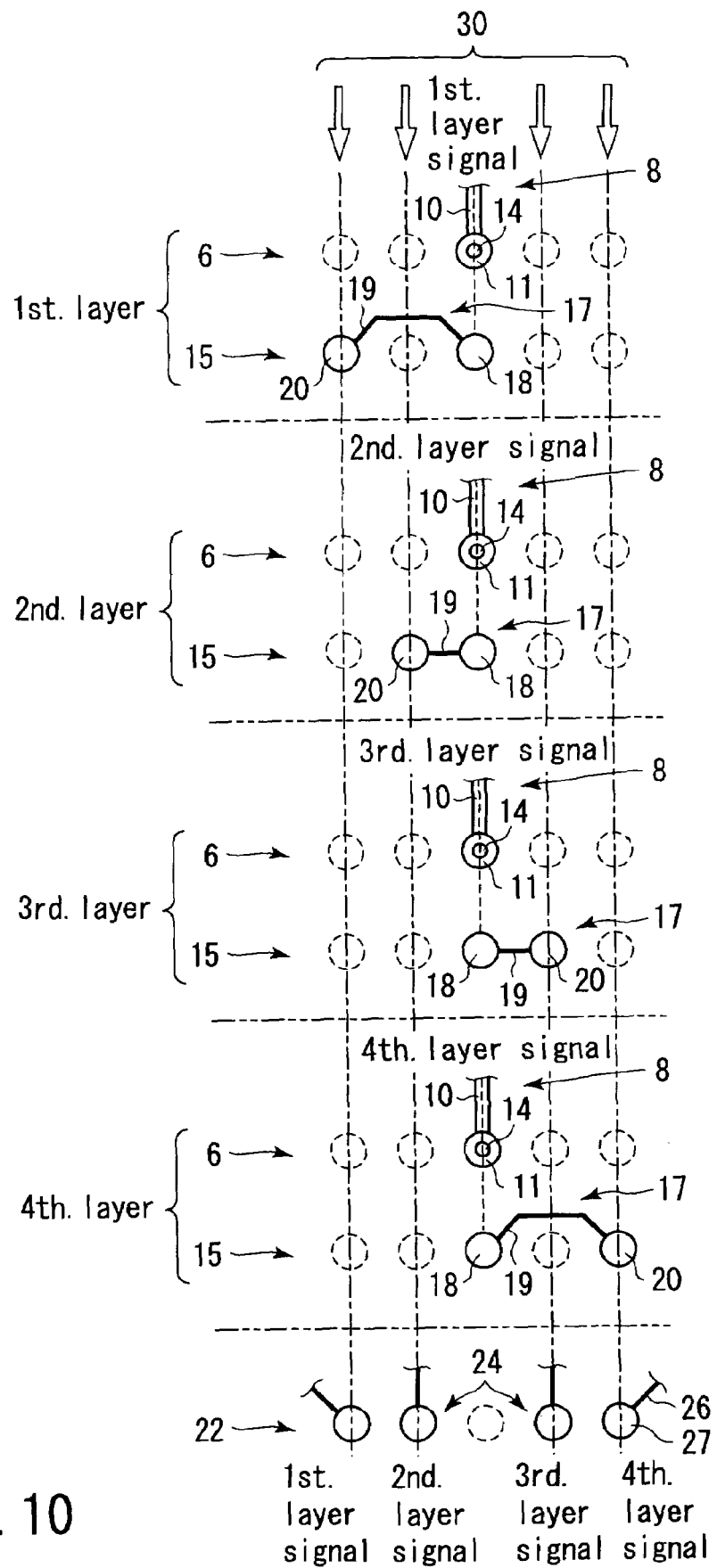
FIG. 10 is a sectional view schematically showing the interconnection patterns of a chip interconnection and intermediate interconnection in each layer in the semiconductor device according to the embodiment.

The interconnection structure inside the SBM 1 will be explained in detail by referring to an example shown in FIGS. 9 and 10. The interconnection structure inside the SBM 1 shown in FIGS. 9 and 10 is one of various interconnection patterns. More specifically, FIGS. 9 and 10 schematically illustrate an interconnection structure near the interlevel connection land 11 of the chip interconnection 8 and the interlevel connection land 18 of the intermediate interconnection 17 among many interconnections formed inside the SBM 1. In FIGS. 9 and 10, an interconnection structure near the lands 11 and 18 is shown by giving attention to interlevel connection lands 11 and interlevel connection lands 18 which are formed at the same portions along the stacking direction among the interlevel connection lands 11 and 18 in the first to fourth layers.

As described above, the chip interconnections 8 in the first to fourth layers are formed into substantially the same pattern on the major surfaces of the four chip mounting bases 6. More specifically, as shown in FIG. 10, in the chip interconnections 8 in the respective layers, the interlevel connection lands 11 and interlevel connection bumps 14 are formed at the same portions along the stacking direction. The relay lines 10 extend from the interlevel connection lands 11 in the same direction. The interlevel connection lands 11 in the respective layers are electrically connected via the relay lines 10 and the like to the stud bumps 5 of the semiconductor chips 2 mounted on the chip mounting bases 6 in the respective layers. To the contrary, as described above, the intermediate interconnections 17 in the first to fourth layers are formed on the major surfaces of the four interconnection bases 15 with different patterns that are also different from the pattern of the chip interconnections 8. In FIG. 10, the interlevel interconnections 30 and their formation positions are represented by chain lines and outline arrows. The first to fourth layers are divided by chain double-dashed lines.

As shown in FIG. 10, in the intermediate interconnections 17 in the respective layers, the interlevel connection lands 18 are formed at the same portions along the stacking direction. Each interlevel connection land 18 is formed at a position where it faces the interlevel connection land 11 of the chip interconnection 8 in the same layer. When the chip mounting base 6 and interconnection base 15 are integrated, the chip interconnection 8 and intermediate interconnection 17 are electrically connected in each layer via the interlevel connection lands 11 and 18, as represented by a broken line in FIG. 10. The through hole lands 20 are formed at positions different between the layers so as not to overlap each other along the stacking direction. The relay line 19 is so formed as to electrically connect the interlevel connection land 18 and through hole land 20 in each layer. The relay line 19 is formed at a position where it does not electrically contact the interlevel interconnection 30 extending through the through hole lands 20 at once along the stacking direction.

As for the external terminal interconnections 24 formed on the external terminal base 22, the through hole lands 27 are formed at positions where they overlap the through hole lands 20 in the respective layers along the stacking direction. That is, the through hole lands 27 are formed at positions where they are electrically connected to the through hole lands 20 in the respective layers via the interlevel interconnections 30.

With the interconnection structure formed by these patterns, signal paths from the interlevel connection lands 11 in the first to fourth layers that are formed at the same positions along the stacking direction can be switched between the layers so as not to short-circuit the paths, as represented by chain lines in FIG. 9. The stud bumps 5 of the semiconductor chips 2 in the respective layers can be electrically connected to wiring lines outside the SBM 1 or the like via the intermediate interconnections 17, interlevel interconnections 30, and the like by electrically independent signal paths in the first to fourth layers.

For example, all the four semiconductor chips 2 are formed from memory chips. In this case, in order to increase the information amount which can be stored in the whole SBM 1, the data pins of the memory chips must be individually extracted to external terminals. This interconnection structure can be easily implemented by applying the embodiment. To synchronize input/output of signals in, e.g., two predetermined memory chips among the four memory chips, the clock pins of the two memory chips suffice to be electrically connected. In this case, in the intermediate interconnections 17 of two predetermined layers in which the two memory chips are mounted, only through hole lands 20 which are electrically connected to the clock pins of the two memory chips suffice to be formed at positions where the through hole lands 20 overlap each other along the stacking direction. This interconnection structure can also be easily implemented by applying the embodiment.

A semiconductor device manufacturing method according to the embodiment will be explained with reference to FIGS. 5A to 9.

Figure 5A:
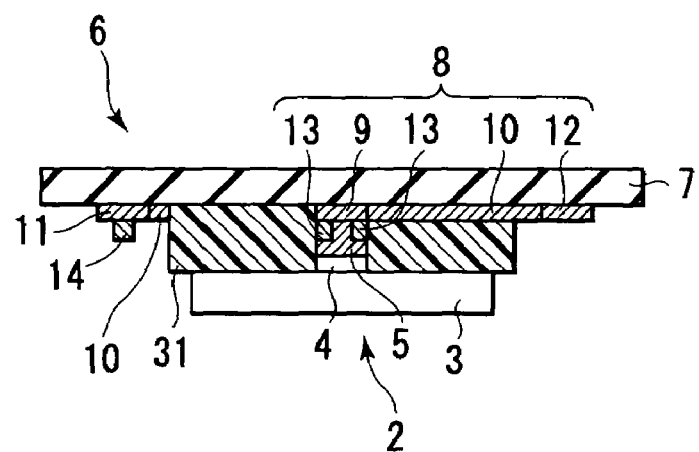
FIG. 5A is a sectional view showing a step in a semiconductor device manufacturing method according to the embodiment.
Figure 5B:
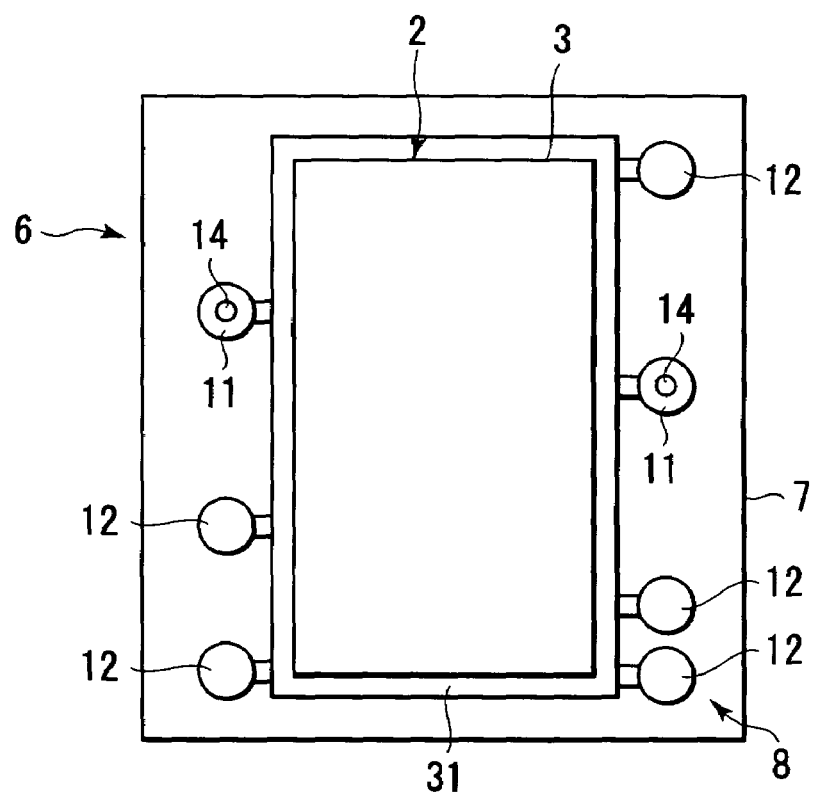
FIG. 5B is a plan view showing the semiconductor device manufacturing method according to the embodiment.

As shown in FIGS. 5A and 5B, a semiconductor chip 2 is mounted on a chip mounting base 6 by using, e.g., a flip chip method. At this time, the stud bump 5 of the semiconductor chip 2 and the inner lead 9 of a chip interconnection 8 formed on the chip mounting base 6 are made to face each other so as to electrically connect the semiconductor chip 2 and chip interconnection 8 in accordance with a predetermined connection rule. The stud bump 5 of the semiconductor chip 2 and the inner lead 9 of the chip interconnection 8 are electrically connected via a chip connection bump 13 formed on the inner lead 9. A sheet-like chip adhesive 31 having a thickness of, e.g., about 50 µm is interposed in advance between the chip main body 3 of the semiconductor chip 2 and the base main body 7 of the chip mounting base 6. The semiconductor chip 2 is fixed to the chip main body 3 via the adhesive 31. After that, a sheet-like chip adhesive 31 having a thickness of, e.g., about 50 µm is also applied to the lower surface of the semiconductor chip 2.

Figure 6A:
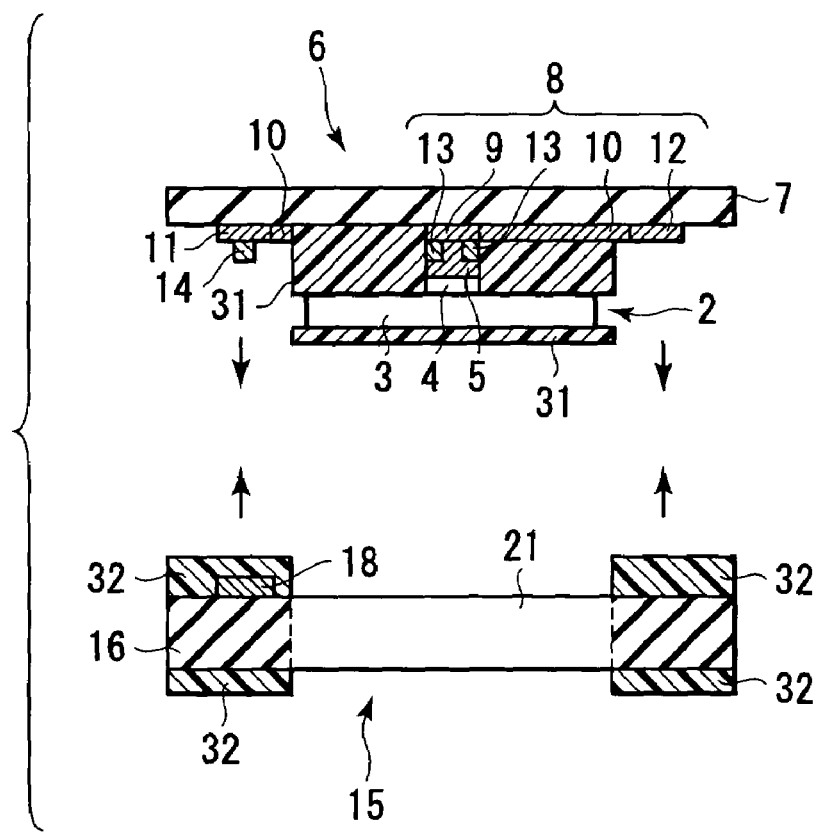
FIG. 6A is a sectional view showing another step in the semiconductor device manufacturing method according to the embodiment.
Figure 6B:
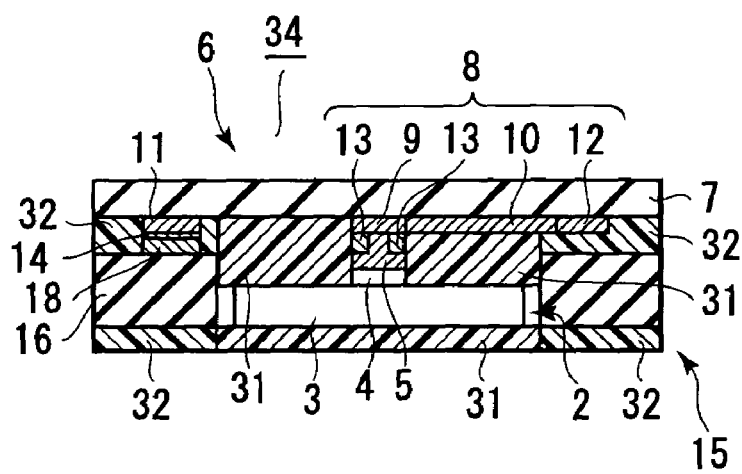
FIG. 6B is a sectional view showing still another step in the semiconductor device manufacturing method according to the embodiment.

As shown in FIGS. 6A and 6B, the chip mounting base 6 having the semiconductor chip 2 and an interconnection base 15 are integrated. The interconnection base 15 is generally formed with a size enough to mount a plurality of chip mounting bases 6 at once on one interconnection base 15. For example, 200 chip mounting bases 6 having semiconductor chips 2 are mounted on one interconnection base 15. In FIGS. 6A to 8B, the chip mounting base 6 and interconnection base 15 are shown with almost the same sizes for illustrative convenience.

As shown in FIG. 6A, the chip mounting bases 6 and interconnection base 15 are made to face each other such that a major surface of each of chip mounting bases 6 on which the chip interconnection 8 is formed and a major surface of the interconnection base 15 on which the intermediate interconnection 17 is formed face each other. At this time, the interlevel connection land 11 of the chip interconnection 8 and the interlevel connection land 18 of the intermediate interconnection 17 are positioned to face each other so as to electrically connect the chip interconnection 8 and intermediate interconnection 17 in accordance with a predetermined connection rule. An interlevel connection adhesive 32 having a thickness of, e.g., about 20 µm is applied to a major surface of the interconnection base 15 that faces the chip mounting base 6. The chip mounting base 6 and interconnection base 15 are pressed or thermally compressed from two outer sides. Consequently, the chip mounting base 6 and interconnection base 15 are provisionally adhered via the interlevel connection adhesive 32.

By these steps, each chip mounting base 6 is mounted at a predetermined position on the predetermined interconnection base 15. At this time, the interlevel connection land 11 of the chip interconnection 8 and the interlevel connection land 18 of the intermediate interconnection 17 are electrically connected via an interlevel connection bump 14 formed on the interlevel connection land 11. In this manner, a single-layered member 34 comprised of a plurality of semiconductor chips 2, a plurality of chip mounting bases 6, and one interconnection base 15 is fabricated, as shown in FIG. 6B. The above-described steps are repeated to fabricate single-layered members 34 for four layers. At this time, an interlevel connection adhesive 32 having a thickness of, e.g., about 20 µm is also applied to a major surface of the interconnection base 15 on which no intermediate interconnection 17 is formed.

The chip interconnections 8 and intermediate interconnections 17 are formed into pattern shapes capable of individually setting signal paths from the stud bumps 5 of the semiconductor chips 2 in the respective layer for each stud bump 5. That is, the chip interconnections 8 are formed into the same patterns for all the four chip mounting bases 6. The intermediate interconnections 17 are formed into patterns which are different between the four interconnection bases 15 and also different from the pattern of the chip interconnections 8. This implements an interconnection structure in which signal paths from the stud bumps 5 are switched between the layers and individually extracted to external terminals 25.

Figure 7:
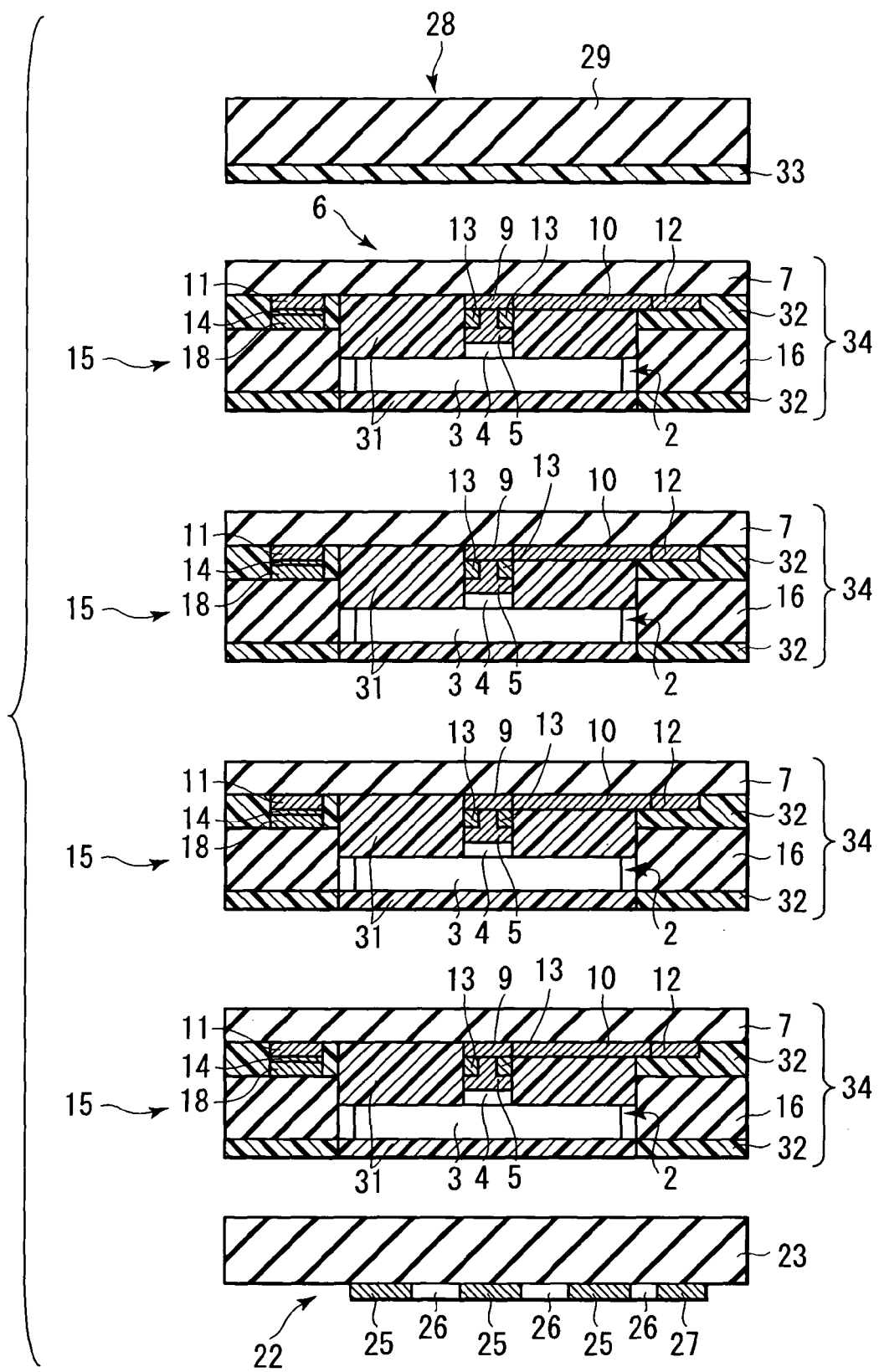
FIG. 7 is a sectional view showing still another step in the semiconductor device manufacturing method according to the embodiment.

As shown in FIG. 7, the four single-layered members 34 are stacked in four layers along the direction of thickness. The postures of the single-layered members 34 are aligned such that the chip mounting bases 6 and interconnection bases 15 in all the layers are located at the same positions to the semiconductor chips 2. The single-layered members 34 are aligned such that the through hole lands 12 of the chip interconnections 8 and the through hole lands 20 of the intermediate interconnections 17 overlap each other along the stacking direction in all the layers.

An external terminal base 22 is arranged adjacent to the interconnection base 15 of the single-layered member 34 in the fourth layer. At this time, the external terminal base 22 is arranged such that a major surface having external terminals 25 faces a direction opposite to the single-layered member 34. The external terminal base 22 is aligned such that the through hole lands 27 of external terminal interconnections 24 formed on the external terminal base 22, the through hole lands 12 of the chip interconnections 8, and the through hole lands 20 of the intermediate interconnections 17 overlap each other along the stacking direction. In addition, an insulating cover 28 is arranged adjacent to the chip mounting base 6 of the single-layered member 34 in the first layer. At this time, a cover adhesive 33 having a thickness of about 20 µm is applied to a major surface of the insulating cover 28 that faces the chip mounting base 6.

The insulating cover 28, four single-layered members 34, and external terminal base 22 are pressed or thermally compressed at once from two outer sides in the stacking direction. As a result, the zeroth insulating cover 28, first to fourth single-layered members 34, and fifth external terminal base 22 are integrated via the interlevel connection adhesive 32, cover adhesive 33, and the like.

A plurality of through holes (not shown) are formed in the integrated insulating cover 28, single-layered members 34, and external terminal base 22 so as to extend at once in the stacking direction through the through hole lands 12 of the chip interconnections 8 and the through hole lands 20 of the intermediate interconnections 17 in the respective layers, and the through hole lands 27 of the external terminal interconnection 24. The through holes are so formed as to extend through through hole lands 12, 20, and 27 complying with a predetermined connection rule out of the through hole lands 12, 20, and 27. More specifically, the through holes are formed by simultaneously forming holes in the integrated insulating cover 28, single-layered members 34, and external terminal base 22 with a drill or the like.

As shown in FIG. 8B, interlevel interconnections 30 are formed in the through holes. More specifically, Cu (copper) interconnections 30a having a thickness of, e.g., about 15 µm are so formed as to cover the inner walls of the through holes. The Cu interconnections 30a are formed by, e.g., electroplating. Subsequently, Ni (nickel) interconnections 30b having a thickness of, e.g., about 3 to 5 µm are formed on the inner walls of the Cu interconnections 30a. The Ni interconnections 30b are formed by, e.g., electroless plating. Finally, Au (gold) interconnections 30c having a thickness of, e.g., about 0.05 µm are formed on the inner walls of the Ni interconnections 30b. The Au interconnections 30c are formed by, e.g., electroless plating.

In the interconnection structure formed by these steps, the signal paths of the stud bumps 5 in the first to fourth layers that are formed at the same positions along the stacking direction can be switched between the layers so as not to short-circuit the paths, as represented by broken lines in FIG. 9. The stud bumps 5 in the respective layers can be electrically connected to external wiring lines via electrically independent signal paths in all the first to fourth layers. After that, predetermined protection processing such as anti-oxidant treatment is performed for the two ends of each interlevel interconnection 30, and the through hole lands 27 and external terminals 25 of the external terminal base 22.

The insulating cover 28, single-layered members 34, and external terminal base 22 through which the desired interlevel interconnections 30 are formed are divided into a plurality of blocks having a predetermined number of semiconductor chips 2 for each layer. These blocks are designed in advance so as to singly function as a desired semiconductor system. The block according to the embodiment comprises one semiconductor chip 2 in each of the first to fourth layers.

The above-described steps provide an SBM (System Block Module) 1 functioning as a desired semiconductor system.

As described above, according to the embodiment, no chip interconnections 8 having different patterns need be formed on the chip mounting bases 6 in accordance with the layer on which the chip interconnection 8 is to be arranged. The intermediate interconnections 17 having different patterns between the layers suffice to be formed on the interconnection bases 15 which are much smaller in number than the chip mounting bases 6. The burden of managing the chip mounting bases 6 and interconnection bases 15 can be reduced in inverse proportion to an increase in the number of chip mounting bases 6 mounted on one interconnection base 15. In addition, the burden of managing the chip mounting bases 6 and interconnection bases 15 can be reduced in inverse proportion to an increase in the stacking numbers of chip mounting bases 6 and interconnection bases 15. That is, the embodiment completely solves conventional problems owing to board management or the like.

No via plugs need be individually formed in the chip mounting bases 6 and interconnection bases 15. The interlevel interconnections 30 suffice to be formed through the chip mounting bases 6 and interconnection bases 15 in the respective layers at once. This can greatly simplify manufacturing work of the semiconductor device 1. The interconnection structure inside the SBM 1 can be efficiently formed at high precision. The embodiment satisfactorily solves problems caused by via plugs.

In this way, the embodiment can greatly increase the yield and production efficiency and remarkably reduce the manufacturing cost at a production site where multilayered semiconductor packages comprised by stacking a plurality of semiconductor chips in a plurality of layers are mass-produced. Hence, the semiconductor device 1 of the embodiment can be mass-produced at high quality and low cost. The semiconductor device manufacturing method of the embodiment can easily manufacture a high-quality low-cost semiconductor device 1 capable of mass production.

The semiconductor device and semiconductor device manufacturing method according to the present invention are not limited to the above-described embodiment. The present invention can be practiced by variously setting or changing part of the arrangement or process within the gist of the present invention, or properly combining or using various settings.

For example, the chip connection bump 13 is formed on the inner lead 9 of the chip interconnection 8, but may not be formed. A metal thin film having a thickness of about 1 μm may be formed on the surface of the inner lead 9 by electroless plating using, e.g., an alloy (Sn—Ag) of tin and silver. The stud bump 5 of the semiconductor chip 2 and the inner lead 9 may be electrically connected via the metal thin film.

The formation region of the chip interconnection 8 is not limited to one major surface of the chip mounting base 6. The chip interconnections 8 may be formed on the two major surfaces of the chip mounting base 6. Similarly, the formation region of the intermediate interconnection 17 is not limited to one major surface of the interconnection base 15. The intermediate interconnections 17 may be formed on the two major surfaces of the interconnection base 15. The mounting position of the semiconductor chip 2 is not limited to one major surface of the chip mounting base 6. The semiconductor chips 2 may be mounted on the two major surfaces of the chip mounting base 6. The signal paths of the stud bumps 5 of the semiconductor chips 2 in the respective layers suffice not to short-circuit between the layers. The signal paths of the stud bumps 5 of the semiconductor chips 2 in the respective layers suffice to be ensured by desired paths. The semiconductor chips 2 in the respective layers suffice not to interfere with the semiconductor chips 2, chip mounting bases 6, and interconnection bases is in adjacent layers.

As for the number, stacking number, type, size, shape, or function of semiconductor chips 2 mounted in the semiconductor device 1, arbitrary semiconductor chips 2 may be used in accordance with the function of a desired semiconductor device 1. For example, a CPU, image processing engine, and memory chip may be embedded to manufacture the semiconductor device 1 as a hybrid LSI. Similarly, as for the numbers, stacking numbers, sizes, shapes, or materials of chip mounting bases 6 and interconnection bases 15, appropriate bases may be adopted in accordance with the function of a desired semiconductor device 1, and the number, stacking number, size, or shape of semiconductor chips 2 of the semiconductor device 1.

The interlevel interconnections 30 and through holes in which the interlevel interconnections 30 are formed need not always be formed after integrating the insulating cover 28, chip mounting bases 6, interconnection bases 15, and external terminal base 22. The interlevel interconnections 30 and through holes may be formed at proper timings as far as interconnections in the semiconductor device 1 can be electrically properly connected and an increase in the yield, production efficiency, or the quality of the semiconductor device 1 is not inhibited. The interlevel interconnection 30 is not always formed from a multilayered structure of three Cu, Ni, and Au metals described above. The interlevel interconnection 30 may be formed from other metals as far as interconnections in the semiconductor device 1 can be electrically properly connected. At this time, the interlevel interconnection 30 may be formed from a plurality of kinds of metals or only one kind of metal.

The semiconductor device 1 is not always manufactured by dividing the integrated insulating cover 28, chip mounting bases 6, interconnection bases 15, and external terminal base 22 of a plurality of devices into single devices. A single semiconductor device 1 may be manufactured from the beginning of the manufacturing process unless an increase in the yield, production efficiency, or the quality of the semiconductor device 1 is inhibited.

Additional advantages and modifications will readily occur to those skilled in the art. Therefore, the invention in its broader embodiments is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a plurality of semiconductor chips having a plurality of terminals;
two chip mounting bases on each of which at least one of the semiconductor chips is mounted and a plurality of chip interconnections electrically connected to the terminals of the mounted semiconductor chip are formed into substantially the same pattern and which are stacked in two layers along a direction of thickness;
one interconnection base which is interposed between the two chip mounting bases and on which a plurality of intermediate interconnections electrically connected to the chip interconnections are formed into a pattern different from the pattern of the chip interconnections; and
a plurality of interlevel interconnections which are formed in a plurality of through holes extending through the chip mounting bases and the interconnection base at once along a stacking direction and electrically connect the chip interconnections and the intermediate interconnections in the stacking direction of the bases.

2. A device according to claim 1, wherein:
the chip interconnections and the intermediate interconnections are formed on facing major surfaces of at least one of the two chip mounting bases and the interconnection base.

3. A device according to claim 1, wherein:
the through holes extend through feedthrough terminals of the chip interconnections and the intermediate interconnections.

4. A device according to claim 1, wherein:
the intermediate interconnections are formed into a pattern capable of setting signal paths from the terminals independently for each terminal and each layer.

5. A device according to claim 4, wherein:
the intermediate interconnections are formed into a pattern capable of switching, between the layers for each terminal, signal paths between the terminals and a plurality of external terminals which externally electrically connect the semiconductor chips.

6. A semiconductor device comprising:
a plurality of semiconductor chips having a plurality of terminals;
two chip mounting bases on each of which at least one of the semiconductor chips is mounted and a plurality of chip interconnections electrically connected to the terminals of the mounted semiconductor chip are formed into substantially the same pattern and which are stacked in two layers along a direction of thickness;
a first interconnection base which is interposed between the two chip mounting bases and on which a plurality of intermediate interconnections electrically connected to the chip interconnections are formed into a pattern different from the pattern of the chip interconnections;
a second interconnection base which is arranged together with the first interconnection base alternately with the chip mounting bases and on which a plurality of intermediate interconnections electrically connected to the chip interconnections are formed into a pattern different from the pattern of the chip interconnections and the pattern of the intermediate interconnections formed on the first interconnection base; and
a plurality of interlevel interconnections which are formed in a plurality of through holes extending through the chip mounting bases, the first interconnection base, and the second interconnection base at once along a stacking direction and electrically connect the chip interconnections and the intermediate interconnections in the stacking direction of the bases.

7. A device according to claim 6, wherein:
the chip interconnections and the intermediate interconnections are formed on facing major surfaces of the bases for a pair of at least one of the two chip mounting bases and the first or second interconnection base adjacent to the chip mounting base.

8. A device according to claim 6, wherein:
the chip interconnections and the intermediate interconnections are formed on facing major surfaces of the bases for a pair of one of the two chip mounting bases and the first interconnection base and a pair of the other chip mounting base and the second interconnection base.

9. A device according to claim 6, wherein:
the through holes extend through feedthrough terminals of the chip interconnections and the intermediate interconnections.

10. A device according to claim 6, wherein:
the intermediate interconnections are formed into a pattern capable of setting signal paths from the terminals independently for each terminal and each layer.

11. A device according to claim 10, wherein:
the intermediate interconnections are formed into a pattern capable of switching, between the layers for each terminal, signal paths between the terminals and a plurality of external terminals which externally electrically connect the semiconductor chips.

12. A semiconductor device comprising:
a plurality of semiconductor chips having a plurality of terminals;
a plurality of chip mounting bases on each of which at least one of the semiconductor chips is mounted and which are stacked in a plurality of layers along a direction of thickness;
a plurality of chip interconnections which are formed into substantially the same pattern on the chip mounting bases and electrically connected to the terminals of the semiconductor chips mounted on the chip mounting bases;
a plurality of interconnection bases which are arranged alternately with the chip mounting bases along a stacking direction of the chip mounting bases;
a plurality of intermediate interconnections which are formed into predetermined patterns for the respective interconnection bases that are different from the pattern of the chip interconnections, and electrically connected to the chip interconnections; and
a plurality of interlevel interconnections which are formed in a plurality of through holes extending through the chip mounting bases and the interconnection bases at once along the stacking direction and electrically connect the chip interconnections and the intermediate interconnections in the stacking direction of the bases.

13. A device according to claim 12, wherein:
the chip interconnections and the intermediate interconnections are formed on facing major surfaces of the bases for a pair of a chip mounting base in at least one predetermined layer among the chip mounting bases and at least one interconnection base adjacent to the chip mounting base.

14. A device according to claim 12, wherein:
the number of interconnection bases equal to the number of chip mounting bases are arranged, and the chip interconnections and the intermediate interconnections are formed on facing major surfaces of the bases for all pairs of the chip mounting bases and the interconnection bases adjacent to the chip mounting bases.

15. A device according to claim 12, wherein:
the through holes extend through feedthrough terminals of the chip interconnections and the intermediate interconnections.

16. A device according to claim 12, wherein:
the intermediate interconnections are formed into a pattern capable of setting signal paths from the terminals independently for each terminal and each layer.

17. A device according to claim 16, wherein:
the intermediate interconnections are formed into a pattern capable of switching, between the layers for each terminal, signal paths between the terminals and a plurality of external terminals which externally electrically connect the semiconductor chips.

* * * * *